(12) United States Patent
Chen et al.

(10) Patent No.: US 10,401,990 B2
(45) Date of Patent: Sep. 3, 2019

(54) PRESSURE SENSING INPUT EQUIPMENT COMPRISING PRESSURING SENSING ELECTRODES

(71) Applicant: TPK Touch Solutions (Xiamen) Inc., Xiamen (CN)

(72) Inventors: Feng Chen, Fuzhou (CN); Jiayou He, Xiamen (CN); Kunxiong Ye, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 15/206,298

(22) Filed: Jul. 10, 2016

(65) Prior Publication Data

US 2017/0010703 A1   Jan. 12, 2017

(30) Foreign Application Priority Data

Jul. 10, 2015   (CN) .......................... 2015 1 0404033

(51) Int. Cl.
*G06F 3/041* (2006.01)
*G02F 1/1333* (2006.01)
(Continued)

(52) U.S. Cl.
CPC ............ *G06F 3/041* (2013.01); *G02F 1/1368* (2013.01); *G02F 1/13338* (2013.01); *G02F 1/13439* (2013.01); *G02F 1/133345* (2013.01); *G02F 1/133514* (2013.01); *G02F 1/133528* (2013.01); *G02F 1/134309* (2013.01); *G02F 1/136286* (2013.01); *G06F 3/044* (2013.01);
(Continued)

(58) Field of Classification Search
CPC . G06F 2203/04104; G06F 2203/04105; G06F 2203/04106; G06F 3/044
See application file for complete search history.

(56) References Cited

U.S. PATENT DOCUMENTS

| 6,492,979 | B1 * | 12/2002 | Kent | ...................... | G06F 3/0414 |
| | | | | | 178/18.01 |
| 2010/0128002 | A1 * | 5/2010 | Stacy | ...................... | G06F 3/016 |
| | | | | | 345/174 |

(Continued)

*Primary Examiner* — Yuzhen Shen
(74) *Attorney, Agent, or Firm* — Cooper Legal Group, LLC

(57) ABSTRACT

A pressure sensing input equipment includes a substrate, a first surface and a second surface, an electrode layer, and a pressure sensing chip. The first surface and the second surface are disposed oppositely. The first surface includes a pressure sensing region and a non-pressure sensing region, in which the area of the non-pressure sensing region is complementary to the area of the pressure sensing region. The electrode layer includes a plurality of pressure sensing electrodes disposed in the pressure sensing region to detect pressure magnitude. The pressure sensing electrodes include a first end part and a second end part. The pressure sensing chip is electrically connected to the pressure sensing electrodes, and the pressure sensing chip determines pressure magnitude by detecting the resistance variation after the pressure sensing electrode was pressured. Such design can achieve double functions that detect touch position and pressure magnitude of the pressure sensing input equipment.

19 Claims, 9 Drawing Sheets

(51) Int. Cl.

| | | |
|---|---|---|
| *G02F 1/1335* | (2006.01) | |
| *G02F 1/1343* | (2006.01) | |
| *G02F 1/1362* | (2006.01) | |
| *G02F 1/1368* | (2006.01) | |
| *G06F 3/044* | (2006.01) | |
| *H05K 1/02* | (2006.01) | |

(52) U.S. Cl.
CPC .......... *G06F 3/0412* (2013.01); *G06F 3/0414* (2013.01); *G06F 3/0416* (2013.01); *H05K 1/0296* (2013.01); *G02F 2001/133357* (2013.01); *G02F 2202/28* (2013.01); *G06F 2203/04102* (2013.01); *G06F 2203/04104* (2013.01); *G06F 2203/04105* (2013.01); *G06F 2203/04106* (2013.01); *G06F 2203/04111* (2013.01)

(56) References Cited

U.S. PATENT DOCUMENTS

| | | | |
|---|---|---|---|
| 2010/0301879 A1* | 12/2010 | Philipp | G06F 3/03547 324/679 |
| 2012/0062506 A1* | 3/2012 | Chae | G06F 3/044 345/174 |
| 2013/0009905 A1* | 1/2013 | Castillo | G06F 3/044 345/174 |
| 2013/0181942 A1* | 7/2013 | Bulea | G06F 3/044 345/174 |
| 2014/0020484 A1* | 1/2014 | Shaw | G01L 1/146 73/862.625 |
| 2014/0293145 A1* | 10/2014 | Jones | G06F 1/1626 349/12 |
| 2015/0116260 A1* | 4/2015 | Hoen | G06F 3/0414 345/174 |
| 2015/0193055 A1* | 7/2015 | Ando | G06F 3/044 345/174 |
| 2015/0331523 A1* | 11/2015 | McMillen | G01L 1/18 345/174 |
| 2015/0378493 A1* | 12/2015 | Kano | G06F 3/044 345/173 |
| 2016/0103545 A1* | 4/2016 | Filiz | G01L 1/18 345/174 |
| 2016/0170543 A1* | 6/2016 | Kawamura | G06F 3/03547 345/174 |
| 2016/0195955 A1* | 7/2016 | Picciotto | G06F 3/044 345/174 |
| 2016/0231849 A1* | 8/2016 | Watazu | G06F 3/044 |
| 2016/0299625 A1* | 10/2016 | Kano | G06F 3/0414 |
| 2016/0313851 A1* | 10/2016 | Dorfner | G06F 3/0416 |
| 2016/0357331 A1* | 12/2016 | Kano | G06F 3/044 |
| 2016/0378256 A1* | 12/2016 | Lee | G06F 3/041 345/174 |

* cited by examiner

PRESSURE SENSING INPUT EQUIPMENT COMPRISING PRESSURING SENSING ELECTRODES

RELATED APPLICATIONS

This application claims priority to Chinese Application Serial Number 201510404033.7, filed on Jul. 10 2015, which is herein incorporated by reference.

BACKGROUND

Field of the Disclosure

The present disclosure relates to input equipments. More particularly, the present disclosure relates to a pressure sensing input equipment.

Description of the Related Art

According to the technology development, touch panels have been widely used in several commercial electrical devices, such as smart phones, tablet computers, cameras, e-books, MP3 players, smart watches, such mobile electrical products, or displays applied to operate controlling devices. Electrical products has been gradually indispensable in our daily life, as the touch panel develops, the functions of the touch panel have been continuously progressed as well, such as touch panel with pressure sensing function.

Currently, there are some products or devices providing pressure sensing function. These products or devices can determine various following actions by detecting external pressure magnitude. However, conventional technologies are still hard to achieve accurate detection of pressure magnitude, and inaccuracy of pressure magnitude detection may strongly decrease experience of the user and further impede the promotion of products. It is noted that how to produce a high-accurate pressure sensing input equipment and still maintain light, thin properties of products is the issue that a person skilled in this art concerns about.

SUMMARY

To overcome the conventional technologies that are not accurate enough for detecting pressure and the problem that the products are thick and heavy, the present disclosure provides a pressure sensing input equipment that reduces product thickness and is accurate in sensing pressure magnitude.

The present disclosure provides a pressure sensing input equipment including a substrate, a first surface of the substrate, a second surface of the substrate, an electrode layer, and a pressure sensing chip. The first surface and the second surface are disposed oppositely, and the first surface includes a pressure sensing region and a non-pressure sensing region, in which the area of the non-pressure sensing region is complementary to the area of the pressure sensing region. The electrode layer includes a plurality of pressure sensing electrodes disposed in the pressure sensing region to detect pressure magnitude. Each of the pressure sensing electrodes includes a first end part and a second end part opposite to the fist end part. The pressure sensing chip and the pressure sensing electrodes are electrically connected, and the pressure sensing chip detects pressure magnitude by detecting resistance variation induced by the pressure sensing electrodes after pressured.

DETAILED DESCRIPTION

To simplify the purposes, technologies, and advantages of the present disclosure, detail descriptions are followed with several figures and embodiments. It is noted that the described embodiments herein are merely used to explain but not to Inuit the present disclosure.

Figure 1:
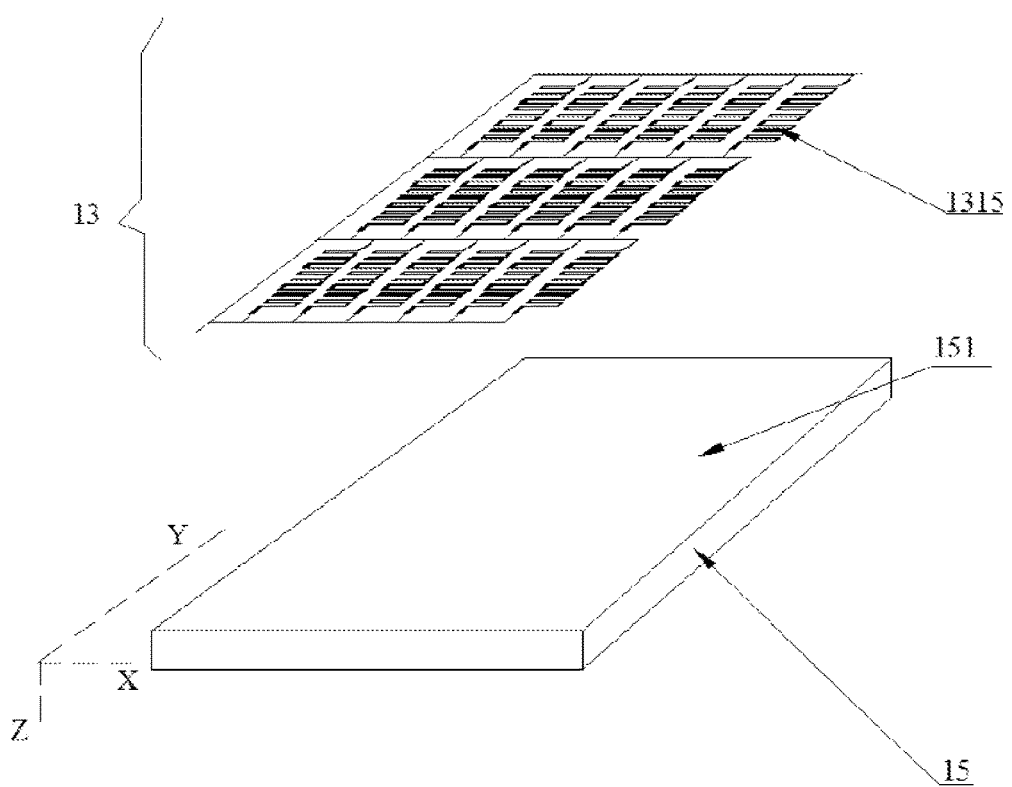
FIG. 1 is an explosion view of a pressure sensing input equipment according, to some embodiments of the present disclosure.

Referring to FIG. 1, FIG. 1 shows a pressure sensing input equipment 1 according to some embodiments of the present disclosure. The pressure sensing input equipment 1 includes a substrate 15, and an electrode layer 13 formed on the substrate 15. The electrode layer 13 is formed on a first surface 141 of the substrate 15 by imprinting, silk printing, etching, coating, and the like. A second surface 143 of the substrate 15 is disposed opposite to the first surface 141. The electrode layer 13 includes a plurality of pressure sensing electrodes 1315 disposed uniformly along X, Y directions. When a user applies a touch to the second surface 143, an applied pressure is transmitted to the electrode layer 13 presented on the first surface 141. Then, the corresponding pressure sensing electrodes 1315 of the electrode layer 13 produce a corresponding reaction, further detecting a touch strength according to the reaction of the pressure sensing electrodes 1315. Accordingly, different touch strengths can implement different operation functions, such design can greatly improve the experience and the satisfaction of the user. The material of the substrate 15 may be hard materials, such as glass, tempered glass, sapphire glass or the like; soft materials, such as polyetheretherketone (PEEK), polyimide (PI), polyethylene terephthalate (PET), Polycarbonate (PC), polymethylmethacrylate (PMMA), poly ethylene succinate (PES) or the combination thereof.

Figure 2:
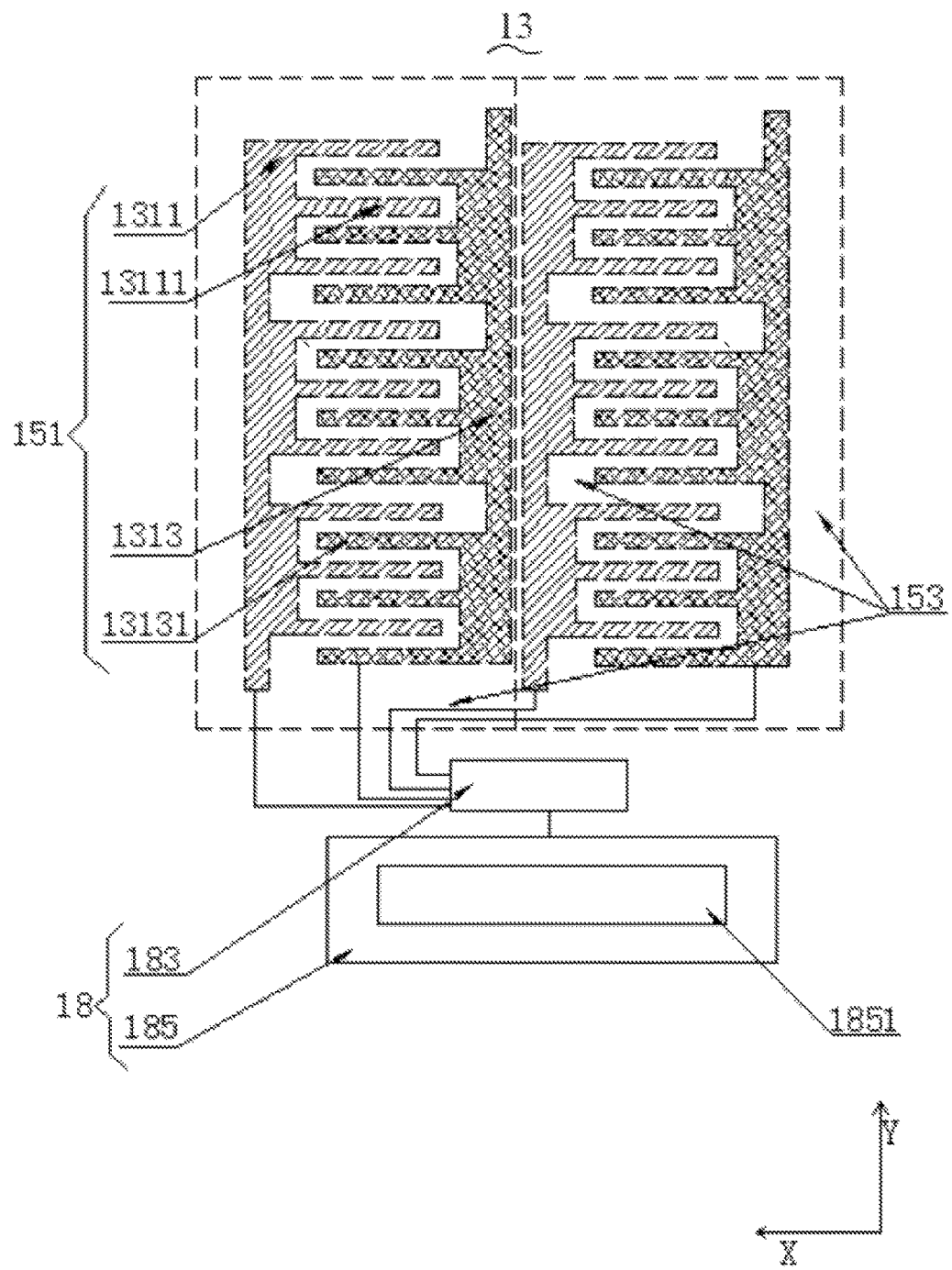
FIG. 2 is a front view of the pressure sensing input equipment according to some embodiments of the present disclosure.
Figure 3:
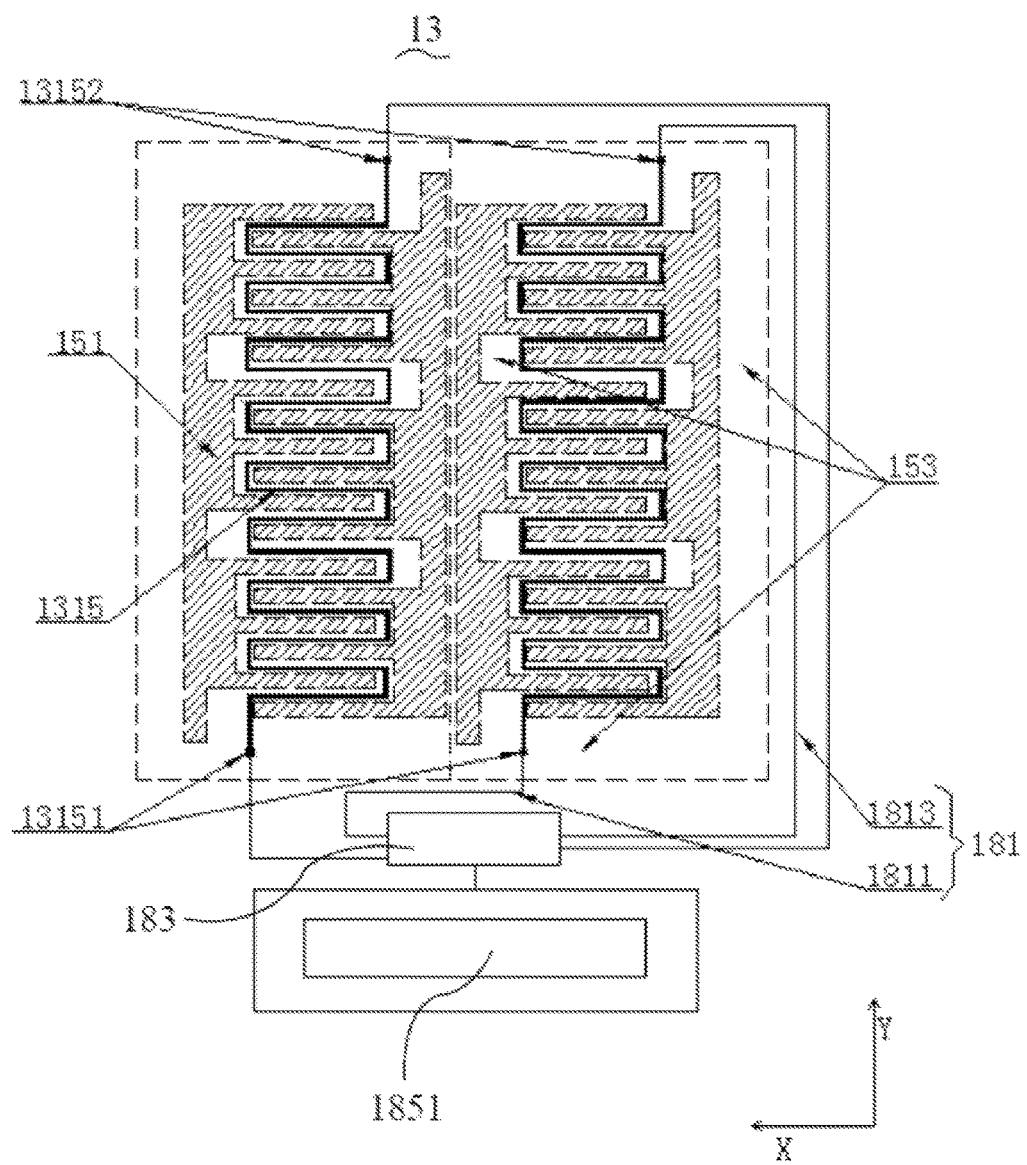
FIG. 3 is a front view of an electrode layer of the pressure sensing input equipment according to some embodiments of the present disclosure.

Reference is made to FIG. 2 and FIG. 3. The pressure sensing input equipment 1 according, to some embodiments of the present disclosure further includes a plurality of first touch sensing electrodes 1311 and a plurality of second touch sensing electrodes 1313. The substrate 15 is separated into a non-pressure sensing region 151 and a pressure sensing region 153. The first touch sensing electrodes 1311 and the second touch sensing electrodes 1313 are disposed in the non-pressure sensing region 151 to detect multipoint touch positions. The first touch sensing electrodes 1311 and the second touch sensing electrodes 1313 are complementarily interleaved. The summation of the area of the first touch sensing electrodes 1311 and the area of second touch sensing electrodes 1313 equals to the area of the non-pressure sensing region 151. The pressure sensing region 153 is the region outside the dash-line region (as Shown) around the first touch sensing electrodes 1311 and the second touch sensing electrode 1313. The first touch sensing electrodes 1311 include several first touch sensing electrodes projection pails 13111 extended along the X-direction, and the second touch sensing electrodes 1313 include several second touch sensing electrode projection parts 13131 extended along the X-direction. The first touch sensing electrode projection parts 13111 and the second touch sensing electrode projection parts 13131 are alternately arranged, forming a complementary pattern. In addition, the non-pressure sensing region 151 and the pressure sensing region 153 are arranged complementarily. The area of the non-pressure sensing region 151 is larger than the pressure sensing region 153. The area of the non-pressure sensing region 151 is complementary to the area of the pressure sensing region 153.

The pressure sensing electrodes 1315, arranged in tortuous path, are disposed in the pressure sensing region 153 of the pressure sensing input equipment 1 and in the space between the first touch sensing electrodes 1311 and the second touch sensing electrodes 1313. Pressure sensing electrodes 1315 do not exceed the boundary of the pressure sensing region 153, such arrangement can not only avoid an effect that a relatively large area of the pressure sensing electrodes 1315 may lead to a correspondingly reduced area of the non-pressure sensing region 151 and influence the sensing of touch position of the first touch sensing electrodes 1311 and the second touch sensing electrodes 1315, but also avoid a poor accuracy of pressure sensing caused by an excessively small area of the pressure sensing electrodes 1315. Each of the pressure sensing electrodes 1315 includes a first end part 13151 and a second end part 13152 opposite to the first end part 13151.

The pressure sensing input equipment 1 further includes an electrical circuit 18. The electrical circuit 18 includes a plurality of electrode connecting wires 181, a flexible printed circuit 183, and a pressure sensing chip 185. The pressure sensing chip 185 includes a Wheatstone bridge circuit 1851. The electrode connecting wires 181 are separated into a plurality of first wires 1811 and a plurality of second wires 1813, one end of each of the first wires 1811 is connected to the FPC 183, and the other end of each of the first wires 1811 is connected to the first end part 13151 of the pressure sensing electrodes 1315. Similarly, one end of each of the second wires 1811 is connected to the FPC 183, and the other end of each of the second wires 1813 is connected to the second end part 13152 of the pressure sensing electrodes 1315. The first wires 1811, the second wires 1813, and the pressure sensing electrodes 1315 form a circuit. The material of the electrode layer 13 and the electrode connecting wires 181 is not limited to ITO, but may also be silver nanowire, copper nanowire, graphene, poly (3,4-ethylenedioxythiophene) (PEDOT): polystyrene sulfonate (PSS) transparent conductive polymer, carbon nanotube, graphene, or the like. At least two sides of the substrate 15 can be frameless design, and obtain a frameless pressure sensing input equipment.

Figure 4:
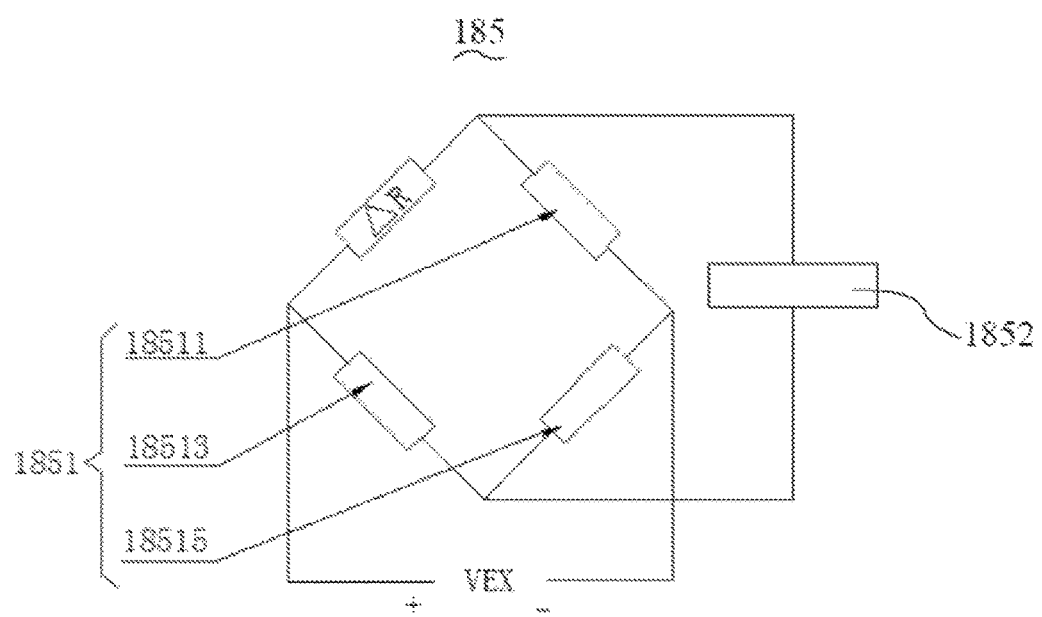
FIG. 4 is an electrical circuit schematic view of a pressure sensing chip of the pressure sensing input equipment according to some embodiments of the present disclosure.

Reference is made to FIG. 4. In the present disclosure, the pressure sensing chip 185 of the pressure sensing input equipment 1 can perform signal processing to resistance variation of the pressure sensing electrodes 1315, and further detects external pressure magnitude more accurately, thereby outputting various control signals. Adler the pressure sensing electrodes 1315 induce resistance variation, since that auxiliary resistors 18511, 18515, and 18513 of the Wheatstone bridge circuit 1851, and the pressure sensing electrodes 1315 are disposed in series-parallel and induce resistance variation, signal variation induced by the resistance variation is processed by the Wheatstone bridge circuit 1851 and then transferred to the pressure sensing chip 185, in which the ΔR in the figure is the resistance variation of the pressure sensing chip 185. Since the resistance variation of the pressure sensing chip 185 is relatively small after pressured, in order to make the following signal analysis and processing easier, here, after the Wheatstone bridge circuit 1851 detects the resistance variation of the pressure sensing electrodes 1315, another module circuit 1852 of the pressure sensing, chip 185 will perform signal amplification, or the like.

After the pressure sensing input equipment 1 is applied by a touch, the pressure sensing input equipment 1 performs pressure sensing, according to the resistance variation, which is induced by the shape deformation of the pressure sensing electrodes 1315. Since the pressure sensing electrodes 1315 form a circuit by the electrodes connecting wires 131 and are connected to the FPC 183, the signal of resistance variation of the pressure sensing electrodes 1315 passes through the FPC 183 and is transmitted to the pressure sensing chip 185 through the Wheatstone bridge circuit 1851, thereby achieving pressure sensing. Generally, the shape deformation and the resistance variation of the pressure sensing electrodes 1315 satisfy the following formula: $GF = (\Delta R/R)/(\Delta L/L)$, where the GF is gage factor, R is an initial value of the pressure sensing electrodes 1315, L is a total length of the corresponding, wire of the pressure sensing electrodes 1315, ΔR is resistance variation of the pressure sensing electrodes 1315, ΔL is wire length variation. In the situation that GF, R, and L remain constant, the larger the wire length variation. ΔL is the easier the resistance variation ΔR can be detected. To obtain a better sensing effect, GF is larger than 0.5.

Figure 5:
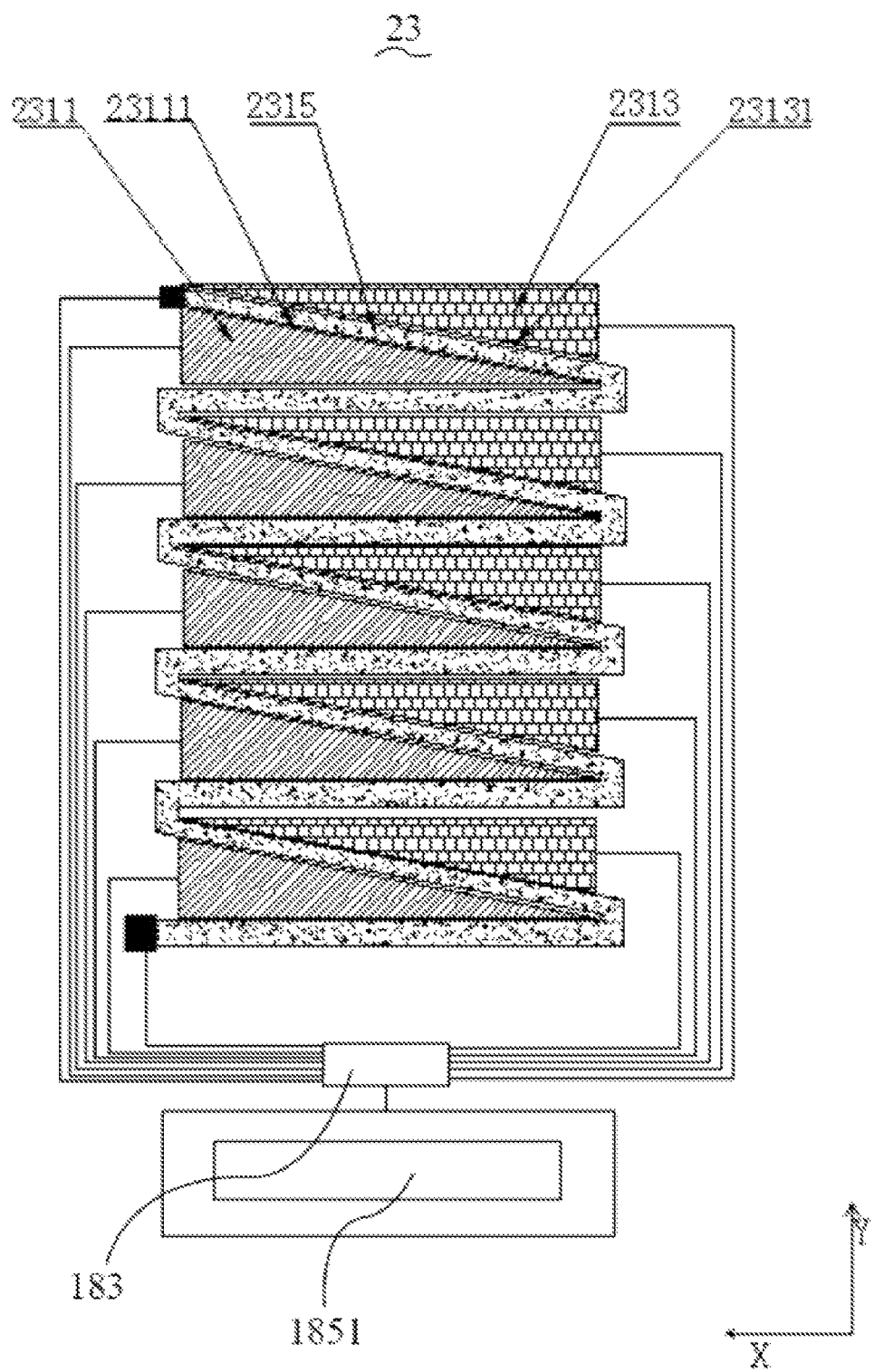
FIG. 5 is a front view of an electrode layer of a pressure sensing input equipment according to some embodiments of the present disclosure

FIG. 5 shows an electrode layer 23 according to some embodiments of the present disclosure. The electrode layer 23 includes a plurality of first touch sensing electrodes 2311, a plurality of second touch sensing electrodes 2313 and a plurality of pressure sensing electrodes 2315. Each of the first touch sensing electrodes 2311 is a right triangle and includes a first touch sensing electrode hypotenuse part 23111. Each of the second touch sensing electrodes 2313 is also a right triangle and includes a second touch sensing electrode hypotenuse part 23131. The first touch sensing electrodes 2311 and the second touch sensing electrodes 2313 are arranged in interleaved. The pressure sensing electrodes 2315 are tortuously arranged in the space of the interleaved structure formed by the first touch sensing electrodes 2311 and the second touch sensing electrodes 2313.

The first touch sensing electrodes 2311 and the second touch sensing electrodes 2313 are not limited to right triangle, but may also be rectangle or parallelogram.

Figure 6:
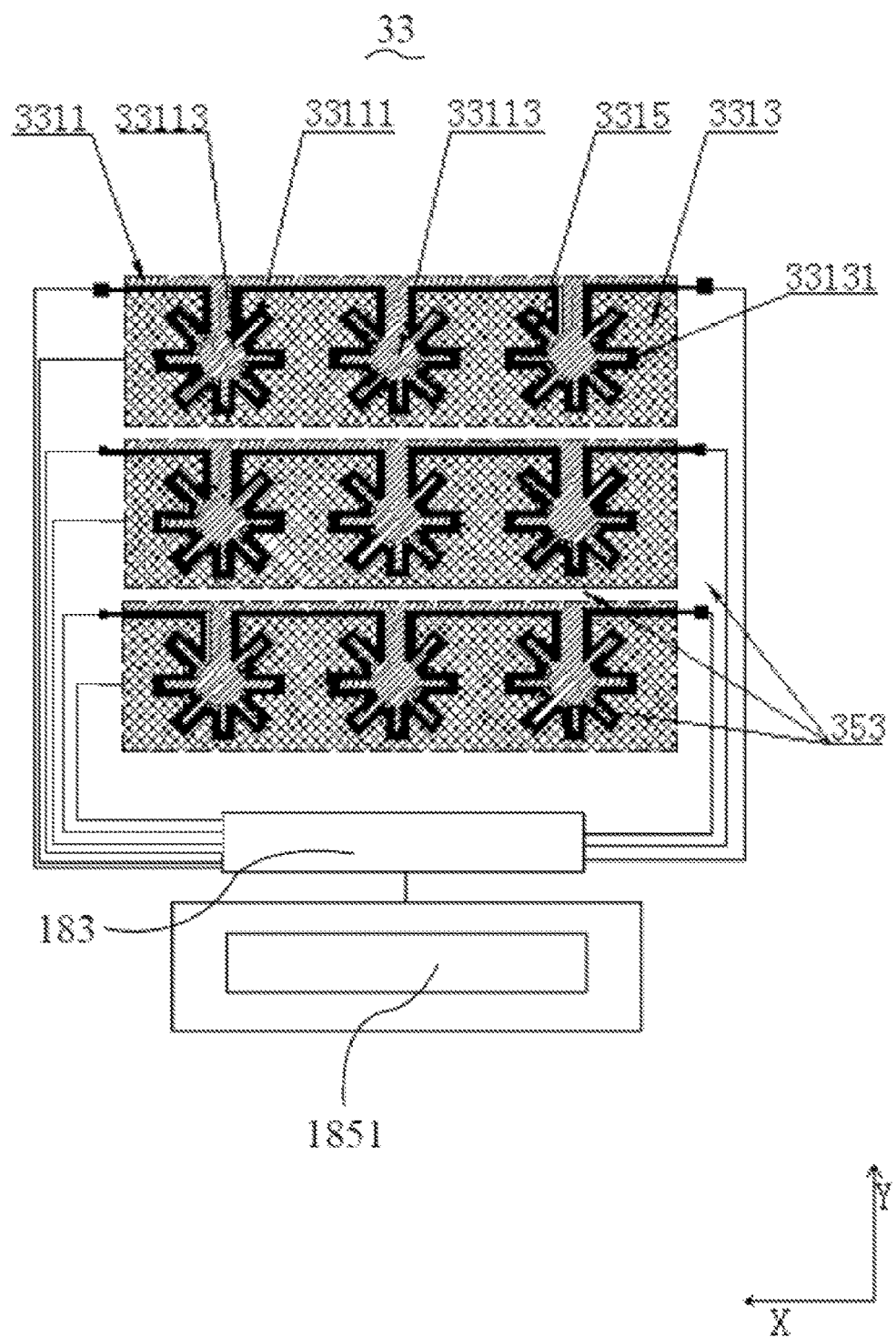
FIG. 6 is a front view of an electrode layer of a pressure sensing, input equipment according to some embodiments of the present disclosure.

FIG. 6 shows an electrode layer 33 according to some embodiments of the present disclosure. The electrode layer 33 includes a plurality of first touch sensing electrodes 3311, a plurality of second touch sensing electrodes 3313 and a plurality of pressure sensing electrodes 3315. The first touch sensing electrodes 3311 are radially arranged in the corresponding radial. interspaces of the second touch sensing electrodes 3313. The first touch sensing electrodes 3311 include a plurality of first touch sensing electrode projection part 33111, and a plurality of first touch sensing electrode spheres 33113 in the middle. The first touch sensing, electrode spheres 33113 are applied as a center. Each of the first touch sensing electrode projection parts 33111 is radially arranged and uniformly spaced with respect to the center. A plurality of second touch sensing electrode recesses 33131 are formed in the second touch sensing electrodes 3313, and the width of the second touch sensing electrode recesses 33131 is larger than the width of the corresponding first touch sensing electrode projection part 33111. Such design can achieve that the first touch sensing electrodes 3311 and the second touch sensing electrodes 3313 are complementarily interleaved, such that the arrangement of touch sensing electrodes is electrically isotropic. The interspaces of the interleaved structure formed by the first touch sensing electrodes 3311 and the second touch sensing electrodes 3315 are pressure sensing regions 353, and the pressure sensing electrodes 3315 are disposed in the pressure sensing regions 353. Each of the pressure sensing, electrodes 3315 is bent into three radial parts, and each of the pressure sensing electrodes 3315 is formed by these three radial parts arranged in series. When a user applies a touch to a surface of an object, the applied strength radially spreads from center toward outside, the magnitude of the strength decreases as the distance to the center increases. Thus, the radial arrangement of the pressure sensing electrodes is in consistent with a strength pattern that the applied strength radially spreads from center toward outside, which is good for sensing the pressure magnitude by the pressure sensing electrodes 3315.

The number of the first touch sensing electrode projection part 33111 is not limited to seven as described.

The pressure sensing electrodes 3315 enter from one side of the interleaved space formed by the first touch sensing electrodes 3311 and the second touch sensing electrodes 3313, and finally go out from the other side. The pressure sensing electrodes 3315 disposed between the first touch sensing electrodes 3311 and the second touch sensing electrodes 3313 can not only save space, but also reduce wiring difficulty, such design that the first touch sensing electrodes 3311, the second touch sensing electrodes 3313, and the pressure sensing electrodes 3315 are disposed in interleaved is also good for system detection, and improves product yield.

Figure 7:
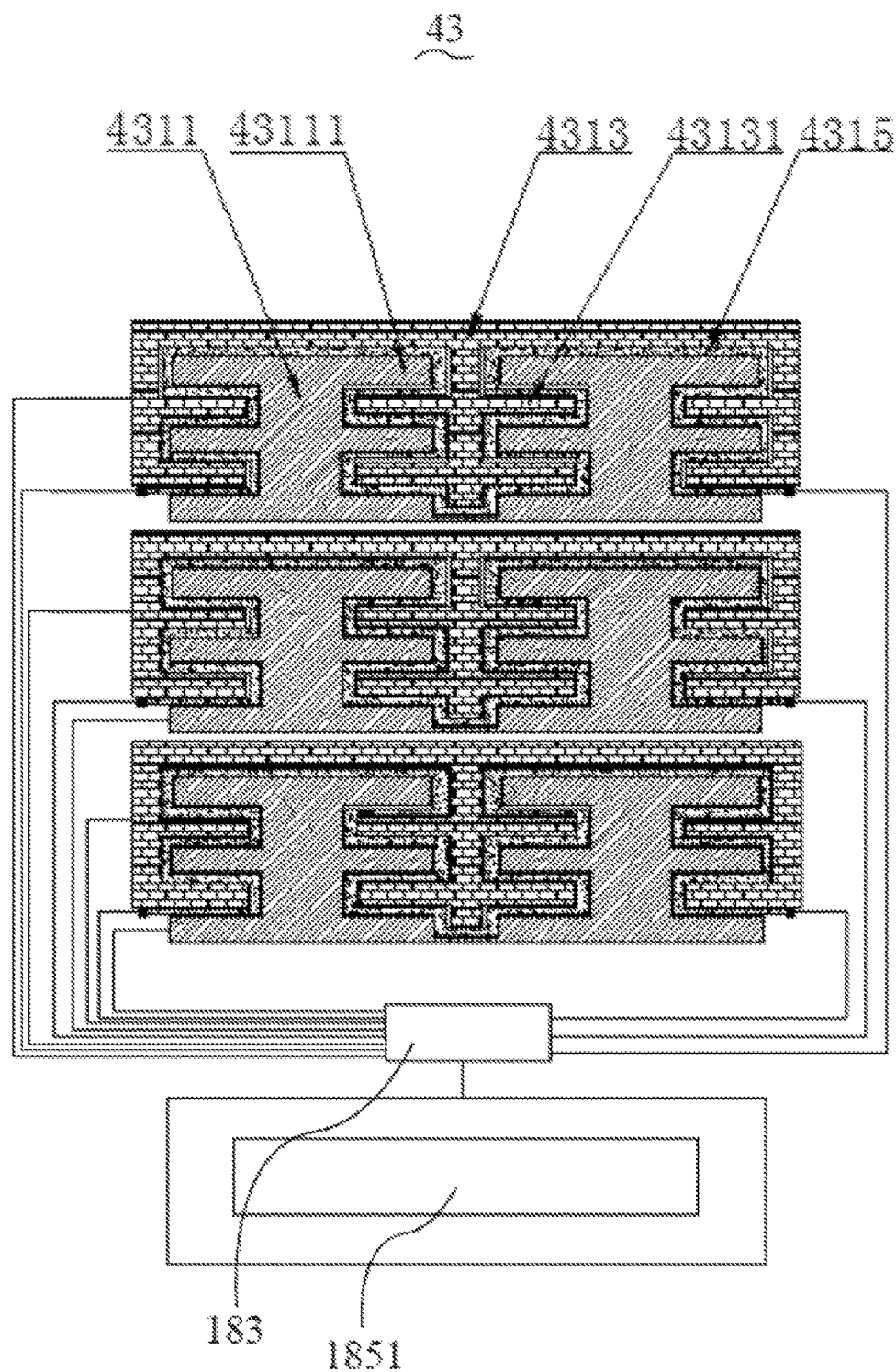
FIG. 7 is a front view of an electrode layer of a pressure sensing input equipment according to some embodiments of the present disclosure.

Reference is made to FIG. 7. The electrode layer 43 includes a plurality of first touch. sensing electrodes 4311, a plurality of second touch sensing electrodes 4313, and a plurality of pressure sensing electrodes 4315. The first touch sensing electrodes 4311 include a plurality of first touch sensing electrode projection part 43111 arranged uniformly, the second touch sensing electrodes 4313 include a plurality of second touch sensing electrode recesses 43131. The first touch sensing electrodes 4311 are arranged in "shift pattern". The first touch sensing electrodes 4311 and the corresponding second touch sensing electrodes 4313 are complementarily interleaved, and such electrode arrangement design can make maximal use of the space of the substrate 45. The special distribution of the second touch sensing electrodes 4313 and the first touch sensing electrodes 4311 is uniform. The pressure sensing electrodes 4315 enter from one side of the interleaved space formed by the first touch sensing electrodes 4311 and the second touch sensing electrodes 4311 finally go out from the other side. The pressure sensing electrodes 4315 disposed between the first touch sensing electrodes 4311 and the second touch sensing electrodes 4313 can not only save space, but also reduce wiring difficulty. The first touch sensing electrodes 4311, the second touch sensing electrodes 4313, and the pressure sensing electrodes 4315 are disposed in interleaved is also good for system detection, and improves product yield as well. To reach better touch sensing and pressure detection, the wire width of the pressure sensing electrodes 4315 is 0.5 to 0.8 times the wire width of the corresponding first touch sensing electrode projection part 43111 and the second touch sensing electrode recess 43131. Generally, the wire width of the pressure sensing electrodes 4315 ranges from 5 µm to 300 µm.

Figure 8:
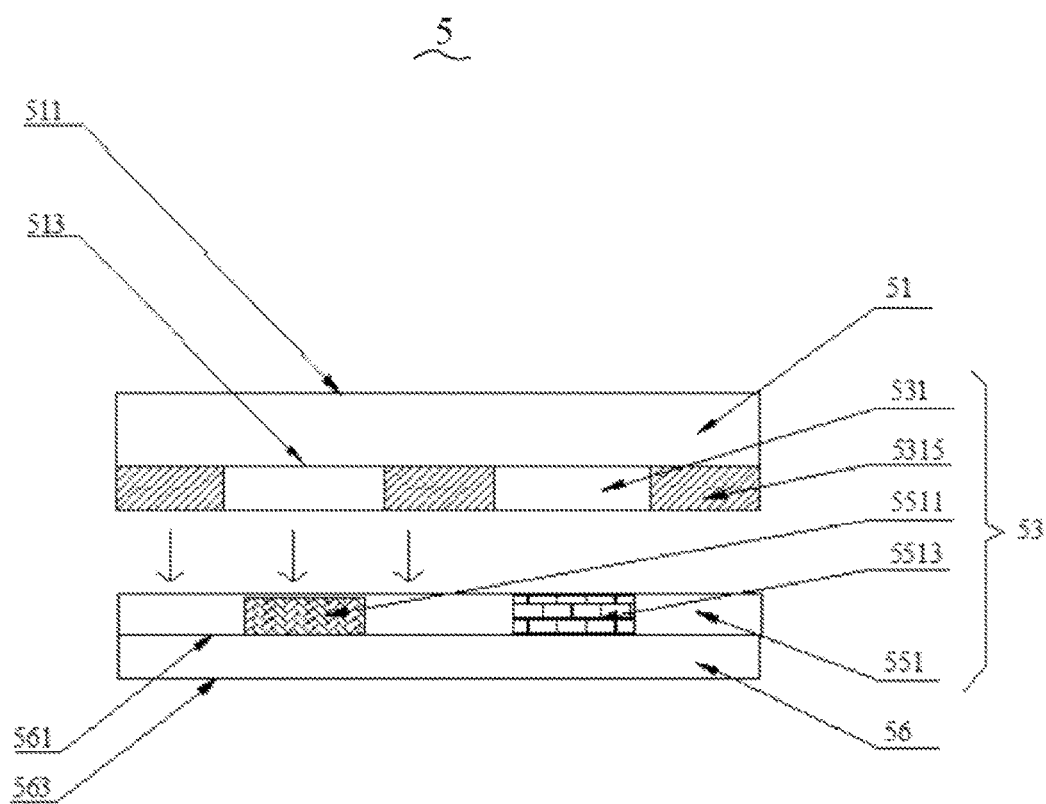
FIG. 8 is a layer structure view of a pressure sensing input equipment according to some embodiments of the present disclosure.

FIG. 8, shows a pressure sensing input equipment 5 according to some embodiments of the present disclosure. The pressure sensing input equipment 5 includes a cover board 51, an electrode layer 53, and a substrate 56. The cover board 51 includes a cover board first surface 511 and a cover board second surface 513 disposed opposite to the cover board first surface 511. The material of the cover board 51 can be hard plastic, tempered glass, $Al_2O_3$, and such strengthened hard boards. The cover board first surface 511 is an operation surface. The electrode layer 53 includes a first electrode layer 531 and a second electrode layer 551. The first electrode layer 531 includes a plurality of pressure sensing electrodes 5315 and is disposed on the cover board second surface 513. The second electrode layer 551 includes a plurality of first touch sensing electrode 5511 and a plurality of second touch sensing electrode 5513. The second electrode layer 551 is disposed on a first surface 561 of the substrate 56. The cover board second surface 513 and the first surface 561 of the substrate 56 are disposed oppositely. In some embodiments, the first electrode layer 531 and the second electrode layer 551 may be simultaneously arranged on the cover board first surface 511. The cover board second surface 513 is an operation surface, and the cover board 51 is equal to the substrate 56. Alternatively, the first electrode layer 531 may be arranged on the first surface 561 of the substrate 56, and the second electrode layer 551 may be arranged on the second surface 563 of the substrate 56.

Figure 9:
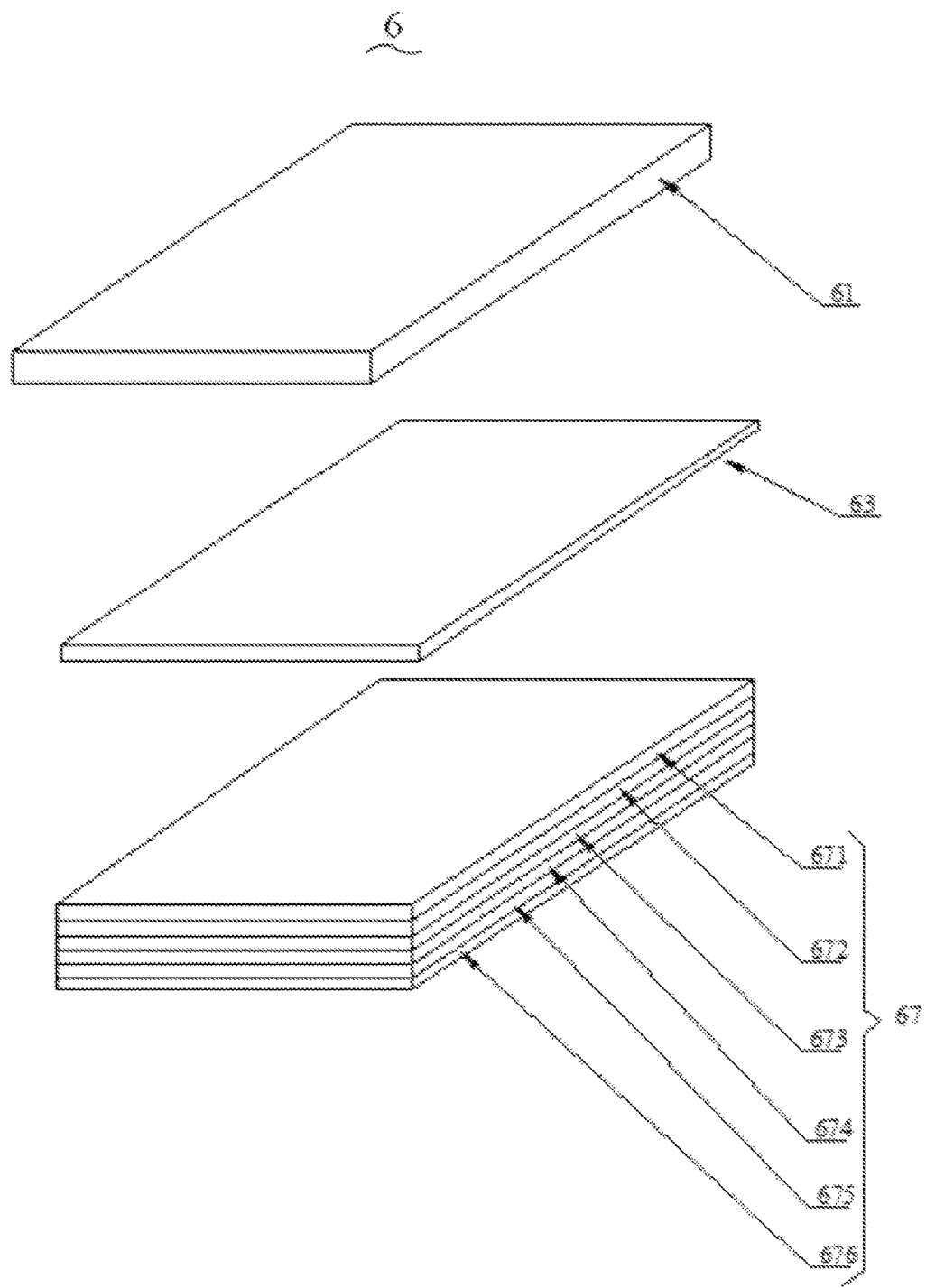
FIG. 9 is an explosion view of a touch module of a pressure sensing input equipment according to some embodiments of the present disclosure.

Reference is made to FIG. 9. A touch module 6 includes a cover board 61, an electrode layer 63, and a display 67. The electrode layer 63 is disposed between the cover board 61 and the display 67. The present disclosure does not limit the kinds of the display 67, which can be liquid crystal, organic light emitting diode (OLED), or plasma. The display 67 includes a top polarizer 671, a top substrate 672, a color filter 673, a liquid layer 674, a driving layer 675, and a bottom substrate 676. The top polarizer 671 is disposed on the top substrate 672. The color filter 673 is disposed under the top substrate 672. The color filter 673 includes several filters that filter different colors. The electrode layer 63 is formed on the top surface of the top polarizer 671. The driving layer 675 is disposed on the bottom substrate 676, and includes several thin film transistor (TFT). The liquid layer 674 is disposed between the color filter 673 and the driving layer 675.

Comparing to the conventional technologies, the substrate 15 of the pressure sensing input equipment 1 of the disclosure is separated into the non-pressure sensing region 151 and the pressure sensing region 153. The area of the non-pressure sensing, region 151 is complementary to the pressure sensing region 153. The pressure sensing electrodes 1315 are arranged in the pressure sensing region 153, such that the detection to the external pressure amplitude can be achieved. The opposite sides of the pressure sensing electrodes 1315 are connected to the Wheatstone bridge 1851 by the electrode connecting wires 181, such configuration can perform signal processing to the resistance variation of the pressure sensing electrode 1315, thereby benefiting the pressure detection.

The first touch sensing electrodes 1311 and the second touch sensing electrodes 1313, which are complementarily interleaved but non-cross, are arranged in the non-pressure sensing region 151, such that the multipoint touch can be achieved. On the other hand, under the condition that the first touch sensing electrodes 1311 and the second touch sensing electrodes 1313 are in a good adjacent relationship, the pressure sensing electrodes 1315 are arranged in the interspace of the interleaved structure formed by the first touch sensing electrodes 1311 and the second touch sensing electrodes 1313, such design can save space, reduce wiring difficulty, and will not affect the touch sensing and the pressure sensing.

The pressure sensing electrodes 1315 are arranged in radial shape, tortuous path, or the like. When the radial shape is applied, it meets a condition that the pressured point will be emitted from the middle to the outside of the pressure, which can improve the deformation ability of the pressure sensing electrodes 1315 when receiving pressure, and further improves the accuracy of pressure sensing.

To improve the deformation ability of the pressure sensing electrodes 1315, ones can reduce the area of the pressure sensing electrodes 1315, so that the area of the pressure sensing electrodes is smaller than the corresponding area of the first touch sensing electrodes 1311 and the second touch sensing electrodes 1315. That is, the area of the non-pressure region 151 is larger than that of the pressure sensing region 153. The wire width of the pressure sensing electrodes 1315 is controlled such that the wire width of the pressure sensing electrodes 1315 is 0.5 to 0.8 times the wire width of the first touch sensing electrodes 1311 and the second touch sensing electrodes 1315 at the corresponding position, and the wire width of the pressure sensing electrodes 1315 ranges from 5 μm to 300 μm, which can improve the deformation ability of the pressure sensing electrodes 1315. The touch module 6 formed by the pressure sensing input equipment 1 and the display 67 of the present disclosure can better achieve detection of touch position and pressure magnitude.

The foregoing descriptions are merely preferred embodiments, and do not limit to the present disclosure. Those skilled in the art should realize that such equivalent constructions do not depart from the spirit and scope of the present disclosure, and that they may make various changes, substitutions, and alterations herein without departing from the spirit and scope of the present disclosure.

What is claimed is:

1. A pressure sensing input equipment, comprising:
a substrate comprising a first surface defining a pressure sensing region and a non-pressure sensing region;
a plurality of pressure sensing electrodes disposed only in the pressure sensing region and configured to detect pressure magnitude of a touch to the pressure sensing input equipment;
a plurality of touch sensing electrodes comprising a plurality of first touch sensing electrodes and a plurality of second touch sensing electrodes, wherein:
the plurality of touch sensing electrodes are disposed only in the non-pressure sensing region for detecting a touch location of the touch to the pressure sensing input equipment,
there is no overlap between the plurality of pressure sensing electrodes and the plurality of touch sensing electrodes,
the plurality of first touch sensing electrodes and the plurality of second touch sensing electrodes are interleaved but do not cross,
the plurality of first touch sensing electrodes are radially disposed in a radial interspace of the plurality of second touch sensing electrodes, and
the plurality of first touch sensing electrodes comprise a plurality of first touch sensing electrode projection parts and a plurality of first touch sensing electrode spheres; and
a pressure sensing chip electrically connected to the plurality of pressure sensing electrodes, wherein after the pressure sensing input equipment receives pressure, the pressure sensing chip detects an induced resistance variation of one or more of the plurality of pressure sensing electrodes to achieve pressure magnitude detection.

2. The pressure sensing input equipment of claim 1, further comprising:
a plurality of first wires, wherein each of the plurality of first wires is connected to a first end part of a corresponding one of the plurality of pressure sensing electrodes;
a plurality of second wires, wherein each of the plurality of second wires is connected to a second end part of a corresponding one of the plurality of pressure sensing electrodes; and
a flexible printed circuit connected to the plurality of first wires and the plurality of second wires, wherein the pressure sensing chip is connected to the plurality of pressure sensing electrodes through the flexible printed circuit.

3. The pressure sensing input equipment of claim 1, wherein the plurality of pressure sensing electrodes are arranged in radial shape or tortuous path in the pressure sensing region.

4. The pressure sensing input equipment of claim 1, wherein an area of the pressure sensing region is smaller than an area of the non-pressure sensing region.

5. The pressure sensing input equipment of claim 1, wherein:
the pressure sensing chip comprises a Wheatstone bridge circuit,
after the pressure sensing input equipment receives the pressure, the Wheatstone bridge circuit detects the induced resistance variation of one or more of the plurality of pressure sensing electrodes.

6. The pressure sensing input equipment of claim 1, wherein:
the substrate is a cover board, and
a second surface of the substrate, diametrically opposite the first surface, is an operation surface.

7. The pressure sensing input equipment of claim 1, further comprising:
a cover board, wherein:
the cover board comprises a first surface and an element installation surface opposite to the first surface,
the first surface is an operation surface, and
the element installation surface is present over the substrate.

8. The pressure sensing input equipment of claim 1, wherein the plurality of first touch sensing electrodes, the plurality of second touch sensing electrodes, and the plurality of pressure sensing electrodes are electrically insulated from each other.

9. The pressure sensing input equipment of claim 8, wherein:

a wire width of the plurality of pressure sensing electrodes is 0.5 to 0.8 times a wire width of the plurality of first touch sensing electrodes and a wire width of the plurality of second touch sensing electrodes, and the wire width of the plurality of pressure sensing electrodes ranges from 5 μm to 300 μm.

10. The pressure sensing input equipment of claim 1, wherein:

the plurality of first touch sensing electrode spheres are set as a center, and the plurality of first touch sensing electrode projection parts are radially arranged and uniformly spaced from each other with respect to the center.

11. The pressure sensing input equipment of claim 1, wherein:

a plurality of second sensing electrode recesses are defined by the plurality of second touch sensing electrodes, the plurality of pressure sensing electrodes are arranged in a radial shape, and the plurality of pressure sensing electrodes are disposed in an interspace of an interleaved structure formed by the plurality of first touch sensing electrode projection parts and the plurality of second sensing electrodes recesses.

12. A pressure sensing input equipment, comprising:

a substrate comprising a first surface and a second surface, wherein:

the first surface and the second surface are disposed oppositely, the first surface comprises a pressure sensing region and a non-pressure sensing region, and an area of the first surface is complementary to another area of the second surface;

an electrode layer comprising a plurality of pressure sensing electrodes disposed in the pressure sensing region and configured to detect pressure magnitude, wherein the plurality of pressure sensing electrodes comprise a first end part and a second end part opposite to the first end part; and a pressure sensing chip electrically connected to the plurality of pressure sensing electrodes, wherein:

after the pressure sensing input equipment receives pressure, the pressure sensing chip detects an induced resistance variation of one or more of the plurality of pressure sensing electrodes to achieve pressure magnitude detection, a plurality of first touch sensing electrodes and a plurality of second touch sensing electrodes are disposed in the non-pressure sensing region for detecting multipoint touch positions, the plurality of first touch sensing electrodes and the plurality of second touch sensing electrodes are interleaved but do not cross, the plurality of pressure sensing electrodes are disposed in gaps between the plurality of first touch sensing electrodes and the plurality of second touch sensing electrodes, the plurality of first touch sensing electrodes, the plurality of second touch sensing electrodes, and the plurality of pressure sensing electrodes are electrically insulated from each other, a wire width of the plurality of pressure sensing electrodes is 0.5 to 0.8 times a wire width of the plurality of first touch sensinq electrodes and a wire width of the plurality of second touch sensinq electrodes, and the wire width of the plurality of pressure sensing electrodes ranges from 5 μm to 300 μm.

13. The pressure sensing input equipment of claim 12, wherein:

the pressure sensing chip comprises a Wheatstone bridge circuit, after the pressure sensing input equipment receives the pressure, the Wheatstone bridge circuit detects the induced resistance variation of one or more of the plurality of pressure sensing electrodes.

14. The pressure sensing input equipment of claim 12, wherein:

there is no overlap between the plurality of pressure sensing electrodes and the plurality of first touch sensing electrodes, and there is no overlap between the plurality of pressure sensing electrodes and the plurality of second touch sensing electrodes.

15. The pressure sensing input equipment of claim 12, further comprising:

a plurality of first wires, wherein each of the plurality of first wires is connected to a first end part of a corresponding one of the plurality of pressure sensing electrodes;

a plurality of second wires, wherein each of the plurality of second wires is connected to a second end part of a corresponding one of the plurality of pressure sensing electrodes; and a flexible printed circuit connected to the plurality of first wires and the plurality of second wires, wherein the pressure sensing chip is connected to the plurality of pressure sensing electrodes through the flexible printed circuit.

16. The pressure sensing input equipment of claim 12, wherein an area of the pressure sensing region is smaller than an area of the non-pressure sensing region.

17. A pressure sensing input equipment, comprising:

a substrate comprising a first surface defining a pressure sensing region and a non-pressure sensing region;

a plurality of pressure sensing electrodes disposed only in the pressure sensing region and configured to detect pressure magnitude of a touch to the pressure sensing input equipment; and a plurality of touch sensing electrodes comprising a plurality of first touch sensing electrodes and a plurality of second touch sensing electrodes, wherein:

the plurality of touch sensing electrodes are disposed only in the non-pressure sensing region for detecting touch location of the touch to the pressure sensing input equipment, there is no overlap between the plurality of pressure sensing electrodes and the plurality of touch sensing electrodes, a first electrode of the plurality of first touch sensing electrodes has a longest dimension extending in a first direction, a second electrode of the plurality of second touch sensing electrodes has a longest dimension extending in the first direction, the first electrode comprises a plurality of first touch sensing electrode projection parts protruding from the first electrode in a second direction perpendicular to the first direction, the second electrode comprises a plurality of second touch sensing electrode projection parts protruding from the second electrode in the second direction, the plurality of first touch sensing electrode projection parts and the plurality of second touch sensing electrode projection parts each intersect a single line extending in the first direction, and a first pressure sensing electrode of the plurality of pressure sensing electrodes is interleaved between the plurality of first touch sensing electrode projection parts and the plurality of second touch sensing electrode projection parts.

18. The pressure sensing input equipment of claim 17, wherein the first pressure sensing electrode intersects the single line extending in the first direction.

19. The pressure sensing input equipment of claim 17, wherein:

the first pressure sensing electrode has a longest dimension extending in the first direction, the first pressure sensing electrode comprises a first end part and a second end part disposed opposite the first end part in the first direction, and a first wire is connected to the first end part and a second wire is connected to the second end part.

* * * * *